US012562685B2

(12) United States Patent　　　(10) Patent No.:　US 12,562,685 B2
Itasaka et al.　　　　　　　　　　(45) Date of Patent:　　Feb. 24, 2026

(54) CIRCUIT DEVICE AND OSCILLATOR

(71) Applicant: SEIKO EPSON CORPORATION,
Tokyo (JP)

(72) Inventors: Yosuke Itasaka, Minowa (JP); Kohei Beppu, Saitama (JP); Naoki Ii, Suwa (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/613,421

(22) Filed: Mar. 22, 2024

(65) Prior Publication Data

US 2024/0322757 A1　　Sep. 26, 2024

(30) Foreign Application Priority Data

Mar. 24, 2023　(JP) ................................. 2023-047696

(51) Int. Cl.
H03B 5/06　　　(2006.01)
H03B 5/36　　　(2006.01)
H03K 5/01　　　(2006.01)
H03L 3/00　　　(2006.01)

(52) U.S. Cl.
CPC ................ H03B 5/36 (2013.01); H03B 5/06 (2013.01); H03B 5/362 (2013.01); H03B 5/368 (2013.01); H03K 5/01 (2013.01); H03L 3/00 (2013.01); H03B 2200/0034 (2013.01);
(Continued)

(58) Field of Classification Search
CPC ... H03B 5/06; H03B 5/30; H03B 5/32; H03B 5/36; H03B 5/362; H03B 5/364; H03B 5/366; H03B 5/368; H03B 2200/0034; H03B 2200/0046; H03B 2200/0082; H03B 2200/0088; H03B 2200/009; H03B 2200/0094; H03K 5/01; H03L 3/00
See application file for complete search history.

(56) References Cited

U.S. PATENT DOCUMENTS 4,871,982 A * 10/1989 Williams ................. H03B 5/06
　　　　　　　　　　　　　　　　　　　　　331/75
5,302,921 A * 4/1994 Shigemori ................ H03L 5/00
　　　　　　　　　　　　　　　　　　　　　331/77
(Continued)

FOREIGN PATENT DOCUMENTS

JP　　2010-178262 A　　8/2010
JP　　2011-504306 A　　2/2011
(Continued)

*Primary Examiner* — Levi Gannon
(74) *Attorney, Agent, or Firm* — Harness, Dickey & Pierce, P.L.C.

(57) ABSTRACT

A circuit device is configured to switching between a first mode in which phase noise of an output clock signal is lower than that in a second mode and the second mode in which power consumption is smaller than that in the first mode, and the circuit device includes an oscillation circuit configured to generate an oscillation signal, a waveform shaping circuit configured to perform waveform shaping on the oscillation signal to obtain a rectangular wave clock signal; and an output circuit configured to output the output clock signal based on the clock signal. A driving capability of the waveform shaping circuit in the first mode is higher than a driving capability of the waveform shaping circuit in the second mode.

13 Claims, 10 Drawing Sheets

(52) U.S. Cl.
 CPC ................ *H03B 2200/0046* (2013.01); *H03B 2200/0082* (2013.01); *H03B 2200/009* (2013.01); *H03B 2200/0094* (2013.01)

(56) References Cited

U.S. PATENT DOCUMENTS

| | | | | |
|---|---|---|---|---|
| 2003/0025568 A1* | 2/2003 | Kubo | .......................... | H03B 5/36 331/158 |
| 2006/0244546 A1* | 11/2006 | Yamamoto | ............... | H03B 5/04 331/158 |
| 2006/0255869 A1* | 11/2006 | Kawashima | ............. | H03B 5/36 331/74 |
| 2007/0024386 A1* | 2/2007 | Yamamoto | ............... | H03B 5/36 331/158 |
| 2009/0088194 A1 | 4/2009 | Petty, Jr. et al. | | |
| 2010/0026403 A1* | 2/2010 | Rana | ...................... | H03B 5/366 331/116 R |
| 2010/0194427 A1 | 8/2010 | Kobayakawa | | |
| 2011/0018604 A1* | 1/2011 | Chang | ...................... | H03L 1/00 327/306 |
| 2012/0092079 A1* | 4/2012 | Huang | ................... | H03B 5/364 331/109 |
| 2014/0035689 A1 | 2/2014 | Ozawa et al. | | |
| 2018/0254742 A1* | 9/2018 | Akhavan | ............... | H03B 5/362 |
| 2019/0006991 A1* | 1/2019 | Marques | ............... | H03B 5/366 |
| 2020/0313614 A1* | 10/2020 | Sawada | ..................... | G05F 3/20 |
| 2021/0200258 A1* | 7/2021 | Malevsky | ................ | G06F 1/04 |

FOREIGN PATENT DOCUMENTS

| | | |
|---|---|---|
| JP | 2014-030141 A | 2/2014 |
| JP | 2015-041921 A | 3/2015 |

* cited by examiner

FIRST MODE (LOW NOISE)
SECOND MODE (LOW POWER CONSUMPTION)

DRIVING CAPABILITY IN FIRST MODE
> DRIVING CAPABILITY IN SECOND MODE

CIRCUIT DEVICE AND OSCILLATOR

The present application is based on, and claims priority from JP Application Serial Number 2023-047696, filed Mar. 24, 2023, the disclosure of which is hereby incorporated by reference herein in its entirety.

BACKGROUND

1. Technical Field

The present disclosure relates to a circuit device, an oscillator, and the like.

2. Related Art

A circuit device is provided with an output circuit for driving a drive load in a subsequent stage. For example, JP-A-2010-178262 discloses a semiconductor integrated circuit including an output circuit capable of switching a drive capability according to the drive load in the subsequent stage.

JP-A-2010-178262 is an example of the related art.

JP-A-2010-178262 discloses switching of a driving capability of the output circuit that buffers a signal that is subjected to waveform shaping to obtain a rectangular wave signal, and does not propose a method of switching between low power consumption and low noise by focusing on a driving capability of a waveform shaping circuit.

SUMMARY

An aspect of the present disclosure relates to a circuit device configured to switching between a first mode in which phase noise of an output clock signal is lower than that in a second mode and the second mode in which power consumption is smaller than that in the first mode, the circuit device includes: an oscillation circuit configured to generate an oscillation signal; a waveform shaping circuit configured to perform waveform shaping on the oscillation signal to obtain a rectangular wave clock signal; and an output circuit configured to output the output clock signal based on the clock signal, and a driving capability of the waveform shaping circuit in the first mode is higher than a driving capability of the waveform shaping circuit in the second mode.

Another aspect of the present disclosure relates to an oscillator configured to switching between a first mode in which phase noise of an output clock signal is lower than that in a second mode and the second mode in which power consumption is smaller than that in the first mode, and the oscillator includes: a resonator; and a circuit device. The circuit device includes an oscillation circuit configured to oscillate the resonator to generate an oscillation signal, a waveform shaping circuit configured to perform waveform shaping on the oscillation signal to obtain a rectangular wave clock signal, and an output circuit configured to output the output clock signal based on the clock signal, and a driving capability of the waveform shaping circuit in the first mode is higher than a driving capability of the waveform shaping circuit in the second mode.

BRIEF DESCRIPTION OF THE DRAWINGS

FIG. 2 shows a detailed configuration example of the circuit device and an oscillator according to the embodiment.

FIG. 3 shows another detailed configuration example of the circuit device and the oscillator according to the embodiment.

DESCRIPTION OF EMBODIMENTS

Hereinafter, an embodiment will be described. The embodiment to be described below does not unduly limit the scope of the claims. Further, all of the components described in the embodiment are not necessarily essential components.

1. Circuit Device and Oscillator

Figure 1:
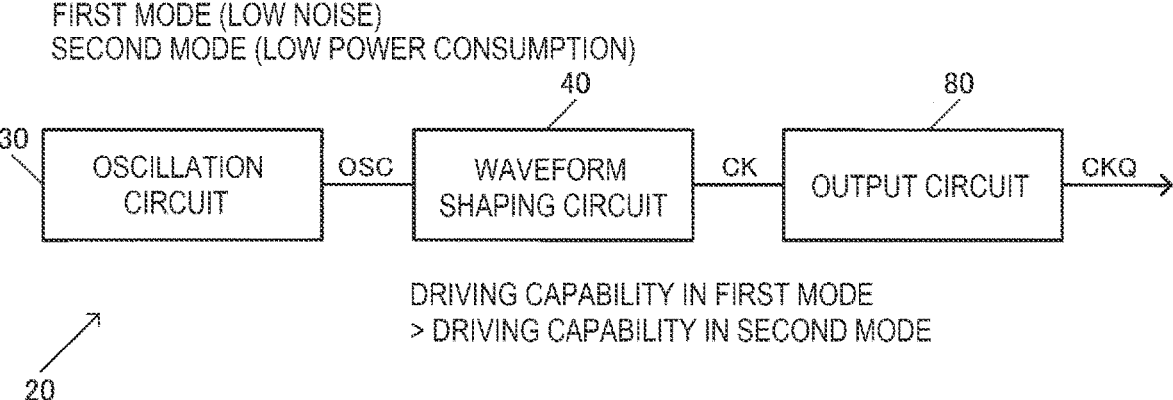
FIG. 1 shows a configuration example of a circuit device according to the embodiment.

FIG. 1 shows a configuration example of a circuit device 20 according to the embodiment. The circuit device 20 according to the embodiment includes an oscillation circuit 30, a waveform shaping circuit 40, and an output circuit 80.

The oscillation circuit 30 generates an oscillation signal OSC. For example, the oscillation circuit 30 generates the oscillation signal OSC by oscillating a resonator or the like. Alternatively, the oscillation circuit 30 may generate the oscillation signal OSC by an LC resonance circuit or the like. The oscillation signal OSC is, for example, a sine wave signal. The oscillation circuit 30 includes a drive circuit or the like for generating the oscillation signal OSC by driving the resonator or the like.

The waveform shaping circuit 40 receives the oscillation signal OSC from the oscillation circuit 30 and performs the waveform shaping on the oscillation signal OSC. For example, the waveform shaping circuit 40 performs the waveform shaping on the oscillation signal OSC so as to obtain the rectangular wave clock signal CK. For example, the waveform shaping circuit 40 performs the waveform shaping on the sine wave oscillation signal OSC and outputs the rectangular wave clock signal CK. The sine wave oscillation signal OSC includes a sine wave signal including a high modulation wave component. The waveform shaping circuit 40 can include one or more buffer circuits for performing the waveform shaping on the oscillation signal OSC.

The output circuit 80 outputs an output clock signal CKQ. For example, the output circuit 80 outputs the output clock signal CKQ based on the clock signal CK. For example, the output circuit 80 buffers the clock signal CK to output the output clock signal CKQ. Alternatively, the output circuit 80 may output a signal obtained by dividing or multiplying a frequency of the clock signal CK as the output clock signal CKQ. For example, a frequency division circuit, a PLL circuit, or the like, which will be described later, may be provided between the waveform shaping circuit 40 and the output circuit 80, and the output circuit 80 may output the output clock signal CKQ obtained by the frequency division circuit dividing the frequency of the clock signal CK from the waveform shaping circuit 40 or the PLL circuit multi-plying the frequency of the clock signal CK from the waveform shaping circuit 40.

The circuit device 20 according to the embodiment can perform switching between a first mode with low phase noise and a second mode with low power consumption. That is, the first mode is a mode in which phase noise of the output clock signal CKQ is lower than that in the second mode. On the other hand, the second mode is a mode in which power consumption of the circuit device 20 is lower than that in the first mode. For example, in the circuit device 20 according to the embodiment, the switching between the first mode and the second mode can be performed by storing switching information to a nonvolatile memory, setting a fuse in a fuse circuit, or the like. For example, by storing information in the nonvolatile memory or setting a fuse, the circuit device 20 is set to the first mode which is a low noise mode for a first product, and the circuit device 20 is set to the second mode which is a low power consumption mode for a second product. Alternatively, the first mode and the second mode may be switched by an external processing device such as a microcomputer writing to a register of the circuit device 20.

In the embodiment, a driving capability of the waveform shaping circuit 40 in the first mode is higher than a driving capability of the waveform shaping circuit 40 in the second mode. The driving capability of the waveform shaping circuit 40 is set by at least one of a driving capability of a driving transistor constituting the waveform shaping circuit 40 and the power supply voltage supplied to the waveform shaping circuit 40. For example, at least one of the driving capability of the driving transistor of the waveform shaping circuit 40 and the power supply voltage in the first mode is higher than that in the second mode. For example, when a P-type transistor and an N-type transistor are provided as the driving transistors, the driving capability of the waveform shaping circuit 40 can be set by driving capabilities of the P-type transistor and the N-type transistor. A driving capa-bility of a transistor is set by, for example, a size of the transistor. Alternatively, the driving capability may be set by a current in current drive. The size of the transistor is defined by W/L which is a ratio of a gate width W and a gate length L of the transistor. The power supply voltage supplied to the waveform shaping circuit 40 is, for example, a power supply voltage supplied to a driving transistor constituting the waveform shaping circuit 40. For example, the power supply voltage is a power supply voltage supplied to a source of a P-type driving transistor. For example, the waveform shap-ing circuit 40 includes at least one buffer circuit, and this buffer circuit performs waveform shaping on the oscillation signal OSC and outputs the rectangular wave clock signal CK. The driving capability of the waveform shaping circuit 40 is set by the driving capability of the driving transistor constituting this buffer circuit and the power supply voltage supplied to the buffer circuit.

As described above, in the embodiment, the driving capability of the waveform shaping circuit 40 in the first mode which is the low noise mode is higher than the driving capability of the waveform shaping circuit 40 in the second mode which is the low power consumption mode. In this manner, a transition period from an L level to an H level or from the H level to the L level when the waveform shaping circuit 40 performs the waveform shaping on the oscillation signal OSC to obtain the rectangular wave clock signal CK can be made shorter in the first mode than that in the second mode. Here, the L level is a low level, and the H level is a high level. By shortening the transition period in the wave-form shaping of the waveform shaping circuit 40 in this manner, it is possible to reduce the phase noise of the clock signal CK output from the waveform shaping circuit 40. That is, by shortening the transition period, the phase noise of the clock signal CK caused by the noise of the oscillation signal OSC input to the waveform shaping circuit 40 and the noise generated by the transistor constituting the waveform shaping circuit 40 can be reduced as compared with a case where the transition period is long. Accordingly, the phase noise of the output clock signal CKQ can also be reduced, and the first mode which is the low noise mode can be implemented. On the other hand, since the driving capability of the waveform shaping circuit 40 in the second mode is smaller than that in the first mode, the power consumption can be reduced, and the second mode which is the low power consumption mode can also be implemented.

In the first mode, at least one of the current flowing from the current source to the driving transistor of the oscillation circuit 30 and the power supply voltage supplied to the oscillation circuit 30 increases to be larger than that in the second mode. In this manner, the first mode which is the low noise mode can be implemented. On the other hand, in the second mode, at least one of the current flowing from the current source to the driving transistor of the oscillation circuit 30 and the power supply voltage supplied to the oscillation circuit 30 decreases to be smaller than that in the first mode, so that the second mode which is the low power consumption mode can be implemented.

Figure 2:
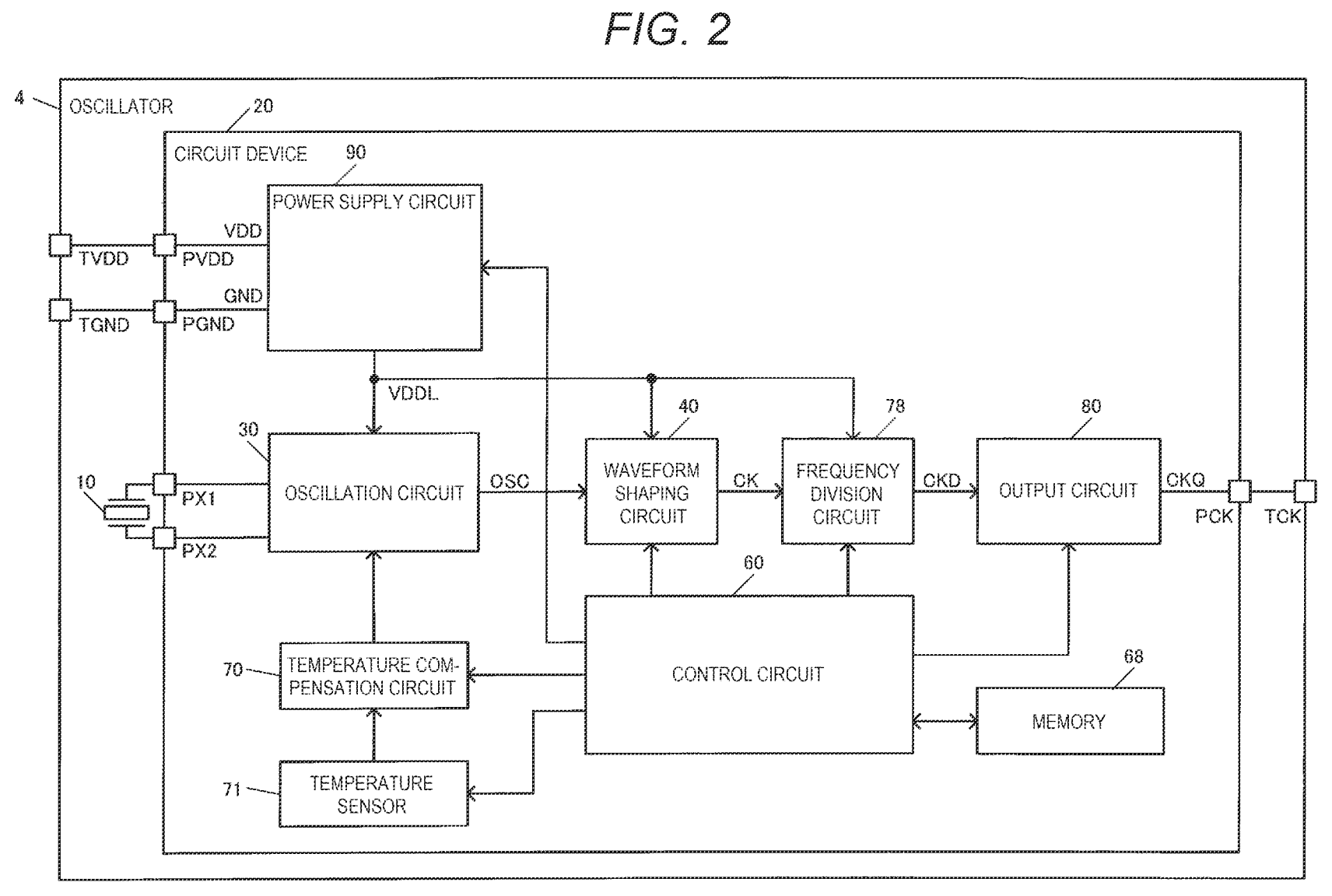

FIG. 2 shows a detailed configuration example of the circuit device 20 and the oscillator 4 including the circuit device 20 according to the embodiment. The oscillator 4 includes the resonator 10 and the circuit device 20. The resonator 10 is electrically coupled to the circuit device 20. For example, the resonator 10 and the circuit device 20 are electrically coupled using an internal wiring, a bonding wire, or a metal bump of a package that accommodates the resonator 10 and the circuit device 20. The circuit device 20 and the oscillator 4 are not limited to the configuration in FIG. 2 and a configuration of FIG. 3 to be described later, and various modifications can be made, such as omitting a part of components, adding other components, or replacing a part of components with other components.

The resonator 10 is an element that generates mechanical resonation by an electric signal. The resonator 10 can be implemented by a resonator element such as a quartz crystal resonator element. For example, the resonator 10 can be implemented by a quartz crystal resonator element in which a cut angle vibrates in a thickness-shear manner such as AT cut or SC cut, a tuning fork type quartz crystal resonator element, a double tuning fork type quartz crystal resonator element, or the like. For example, the resonator 10 may be a resonator built in a simple packaged crystal oscillator (SPXO), or may be a resonator built in a temperature compensated crystal oscillator (TCXO) having no thermo-static oven or a resonator built in an oven-controlled quartz crystal oscillator (OCXO) having a thermostatic oven. The resonator 10 according to the embodiment can also be implemented by various resonator elements such as a reso-nator element other than the thickness-shear vibrating type, the tuning fork type or the double tuning fork type resonator element, or a piezoelectric resonator element made of a material other than quartz crystal. For example, a surface acoustic wave (SAW) resonator, or a micro electro mechanical systems (MEMS) resonator as a silicon resonator formed using a silicon substrate may be adopted as the resonator 10.

The circuit device 20 is an integrated circuit device referred to as an integrated circuit (IC). For example, the circuit device 20 is an IC manufactured by a semiconductor process and is a semiconductor chip in which a circuit element is formed at a semiconductor substrate. The circuit device 20 includes pads PVDD, PGND, PX1, PX2, and PCK. A pad for output enable control of the clock signal or the like may be provided. The pads are terminals of the circuit device 20 which is the semiconductor chip. For example, in a pad area, a metal layer is exposed from a passivation film that is an insulating layer, and the exposed metal layer constitutes the pad that is the terminal of the circuit device 20. The pads PVDD and PGND are a power supply pad and a ground pad, respectively. A power supply voltage VDD from an external power supply device is supplied to the pad PVDD. The pad PGND is a pad to which GND, which is a ground voltage, is supplied. GND can also be referred to as VSS, and the ground voltage is, for example, a ground potential. In the embodiment, the ground is referred to as GND as appropriate. For example, VDD corresponds to a high-potential-side power supply voltage, and GND corresponds to a low-potential-side power supply voltage. The pads PX1 and PX2 are pads for coupling to the resonator 10. The pad PCK is a pad for outputting an output clock signal CKQ. The pads PVDD, PGND, and PCK are electrically coupled to terminals TVDD, TGND, and TCK, respectively, which are external terminals for external coupling of the oscillator 4. For example, the pads and the terminals are electrically coupled using an internal wiring, a bonding wire, or a metal bump of a package.

The oscillation circuit 30 is a circuit that oscillates the resonator 10. For example, the oscillation circuit 30 generates the oscillation signal OSC by oscillating the resonator 10. For example, the oscillation circuit 30 can be implemented by an oscillation drive circuit electrically coupled to one end and the other end of the resonator 10 and a passive element such as a capacitor or a resistor. The drive circuit can be implemented by, for example, a bipolar transistor or a CMOS inverter circuit. The drive circuit is a core circuit of the oscillation circuit 30. The drive circuit drives the resonator 10 by a voltage or a current to oscillate the resonator 10. As the oscillation circuit 30, various types of oscillation circuits such as an inverter type, a Pierce type, a Colpitts type, or a Hartley type oscillation circuit can be used. The oscillation circuit 30 is electrically coupled to the resonator 10 via the pads PX1 and PX2. The pads PX1 and PX2 are pads for coupling to the resonator. A drive circuit 34 for oscillation of the oscillation circuit 30 is provided between the pad PX1 and the pad PX2. The oscillation circuit 30 may include a variable capacitance circuit (not shown). The variable capacitance circuit is, for example, a circuit that changes the capacitance of at least one of one end and the other end of the resonator 10, and the oscillation frequency of the oscillation circuit 30 can be adjusted by adjusting the capacitance of the variable capacitance circuit. That is, by electrically coupling the variable capacitance circuit to at least one of the pads PX1 and PX2, a load capacitance of the oscillation circuit 30 can be variably adjusted. The variable capacitance circuit can be implemented by a variable capacitance element such as a varactor. For example, the variable capacitance circuit includes at least one variable capacitance element. The coupling in the embodiment is electrical coupling. The electrical coupling is coupling in which an electrical signal can be transmitted and information can be transmitted through the electrical signal. The electrical coupling may be coupling via a passive element and the like.

A control circuit 60 is a logic circuit and performs various types of control processes. For example, the control circuit 60 controls the entire circuit device 20 or controls an operation sequence of the circuit device 20. The control circuit 60 may control the oscillation circuit 30, the waveform shaping circuit 40, a memory 68, a temperature compensation circuit 70, a temperature sensor 71, a frequency division circuit 78, the output circuit 80, a power supply circuit 90, or the like. The control circuit 60 can be implemented by a circuit of an application specific integrated circuit (ASIC) based on automatic placement and wiring such as a gate array.

The memory 68 stores various types of information used in the circuit device 20. The memory 68 is, for example, a nonvolatile memory. Although the nonvolatile memory is an EEPROM such as a floating gate avalanche injection MOS (FAMOS) memory or a metal-oxide-nitride-oxide-silicon (MONOS) memory, the nonvolatile memory is not limited thereto and may be a one time programmable (OTP) memory or a fuse ROM. Alternatively, the memory 68 may be implemented by a volatile memory such as a RAM.

The temperature compensation circuit 70 performs temperature compensation on an oscillation frequency of the oscillation circuit 30. The temperature compensation is a process of preventing and compensating a fluctuation of the oscillation frequency due to a temperature fluctuation. Specifically, the temperature compensation circuit 70 performs the temperature compensation based on a temperature detection signal from the temperature sensor 71. For example, the temperature compensation circuit 70 generates a temperature compensation voltage based on a temperature detection voltage from the temperature sensor 71, and outputs the generated temperature compensation voltage to a variable capacitance circuit provided in the oscillation circuit 30, thereby performing the temperature compensation. In this case, the variable capacitance circuit of the oscillation circuit 30 is implemented by a variable capacitance element such as a varactor. For example, when the temperature compensation voltage for compensating frequency-temperature characteristics of a resonator 10 is approximated by a polynomial, the temperature compensation circuit 70 performs the temperature compensation in an analog manner based on coefficient information on the polynomial. Alternatively, the temperature compensation circuit 70 may perform the temperature compensation in a digital manner. In this case, the variable capacitance circuit can be implemented by, for example, a capacitor array and a switch array coupled to the capacitor array, and the temperature compensation circuit 70 can be implemented by, for example, a logic circuit.

The temperature sensor 71 is a sensor that detects a temperature. Specifically, the temperature sensor 71 outputs, as the temperature detection voltage, a temperature-dependent voltage that changes according to a temperature of an environment. Specifically, the temperature sensor 71 outputs the temperature detection voltage whose voltage changes depending on the temperature using, for example, temperature dependence of a forward voltage of a PN junction. A modification using a temperature sensor circuit in the digital manner as the temperature sensor 71 can also be adopted. In this case, temperature detection data may be subjected to D/A conversion to generate the temperature detection voltage. The temperature compensation circuit 70 and the temperature sensor 71 may not be provided.

The frequency division circuit 78 outputs a clock signal CKD obtained by dividing a frequency of the clock signal CK from the waveform shaping circuit 40 by a set frequency division ratio. Setting information of the frequency division ratio is stored in, for example, the memory 68 or the register. Accordingly, the output circuit 80 can output the output clock signal CKQ corresponding to the clock signal CKD whose frequency is divided by the frequency division circuit 78. Alternatively, the PLL circuit that multiplies the frequency of the clock signal CK may be provided between the waveform shaping circuit 40 and the output circuit 80. In this manner, the output circuit 80 can output the output clock signal CKQ having a frequency obtained by multiplying the oscillation frequency. Further, the circuit device 20 according to the embodiment may have a configuration in which the frequency division circuit 78 and the PLL circuit are not provided.

The output circuit 80 buffers and outputs the clock signal CK generated based on the oscillation signal OSC. For example, the output circuit 80 outputs the output clock signal CKQ based on the clock signal CK of the waveform shaping circuit 40. The output clock signal CKQ based on the clock signal CK is, for example, a clock signal obtained by buffering the clock signal CKD obtained by the frequency division circuit 78 dividing the frequency of the clock signal CK, or a clock signal obtained by buffering a signal obtained by the PLL circuit multiplying the frequency of the clock signal CK. In FIG. 2, the output circuit 80 buffers the clock signal CKD from the frequency division circuit 78 and outputs the buffered clock signal CK as the output clock signal CKQ to the pad PCK. For example, the output circuit 80 outputs the output clock signal CKQ in a single-ended CMOS signal format. Alternatively, the output circuit 80 outputs a differential clock signal in a signal format such as low voltage differential signaling (LVDS), positive emitter coupled logic (PECL), high speed current steering logic (HCSL), or differential complementary MOS (CMOS).

The power supply circuit 90 is supplied with the power supply voltage VDD from the pad PVDD and the ground voltage GND from the pad PGND, and supplies various power supply voltages for an internal circuit of the circuit device 20 to the internal circuit. For example, in FIG. 2, the power supply circuit 90 generates the power supply voltage VDDL based on the power supply voltage VDD, and the power supply voltage VDDL is supplied as a power supply voltage of the oscillation circuit 30, the waveform shaping circuit 40, and the frequency division circuit 78. The power supply voltage VDDL is the voltage obtained by regulating the power supply voltage VDD from, for example, the outside by the regulator, and is the voltage obtained by lowering the power supply voltage VDD. The oscillation circuit performs the oscillation operation of driving the resonator 10 based on the power supply voltage VDDL to generate the oscillation signal OSC. In addition, the waveform shaping circuit 40 performs the waveform shaping on the oscillation signal OSC based on the power supply voltage VDDL, and outputs the clock signal CK after being subjected to the waveform shaping. The power supply circuit 90 can also generate a power supply voltage to be supplied to the control circuit 60, the memory 68, the temperature compensation circuit 70, the temperature sensor 71, or the like. The output circuit 80 operates based on, for example, the power supply voltage VDD and outputs the output clock signal CKQ.

Figure 3:
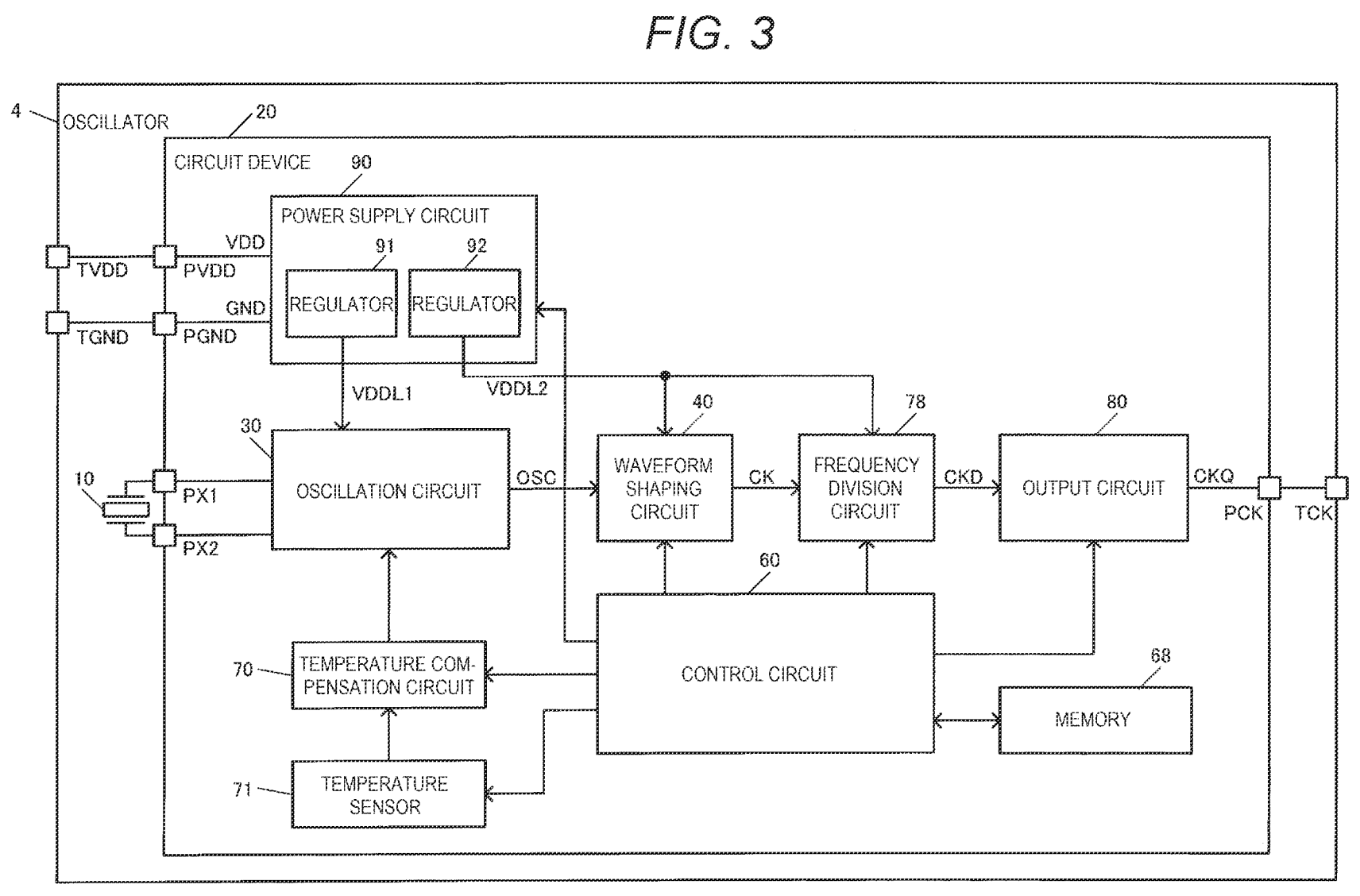

FIG. 3 shows another configuration example of the circuit device 20 and the oscillator 4. FIG. 3 is different from FIG. 2 in that the power supply circuit 90 in FIG. 3 supplies a first power supply voltage VDDL1 to the oscillation circuit 30 and supplies a second power supply voltage VDDL2 different from the first power supply voltage VDDL1 to the waveform shaping circuit 40. In FIG. 3, the second power supply voltage VDDL2 is also supplied to the frequency division circuit 78. Specifically, the power supply circuit 90 includes regulators 91 and 92. The regulator 91 regulates the power supply voltage VDD to generate the first power supply voltage VDDL1, and the regulator 92 regulates the power supply voltage VDD to generate the second power supply voltage VDDL2.

In this manner, in FIG. 3, the oscillation circuit 30 operates by being supplied with the first power supply voltage VDDL1, and the waveform shaping circuit 40 operates by being supplied with the second power supply voltage VDDL2 different from the first power supply voltage VDDL1. In this manner, it becomes possible to individually adjust the first power supply voltage VDDL1 supplied to the oscillation circuit 30 and the second power supply voltage VDDL2 supplied to the waveform shaping circuit 40. Accordingly, the low noise mode and the low power consumption mode can be finely adjusted.

For example, the waveform shaping circuit 40 is supplied with the second power supply voltage VDDL2 smaller than the amplitude of the oscillation signal OSC and operates. For example, an amplitude detection circuit (not shown) that detects the amplitude of the oscillation signal OSC is provided, and the power supply circuit 90 controls the second power supply voltage VDDL2 so as to be smaller than the amplitude of the oscillation signal OSC based on a detection result of an oscillation amplitude. Specifically, the second power supply voltage VDDL2 can be controlled by controlling a resistance ratio in a resistance division circuit of the regulator 92 based on the detection result of the oscillation amplitude. The amplitude of the oscillation signal OSC is, for example, a peak-to-peak voltage of the oscillation signal OSC. The amplitude of the oscillation signal OSC can be detected by, for example, detecting an envelope of the oscillation signal OSC. By making the second power supply voltage VDDL2 to be smaller than the amplitude of the oscillation signal OSC in this manner, the phase noise of the clock signal CK can be reduced and the phase noise of the output clock signal CKQ can be reduced as described later.

Also in FIGS. 2 and 3, in the embodiment, the driving capability of the waveform shaping circuit 40 in the first mode is higher than the driving capability of the waveform shaping circuit 40 in the second mode. For example, the size of the transistor constituting the waveform shaping circuit 40 is set to a size larger in the first mode, which is the low noise mode, than that in the second mode. The power supply voltage VDDL supplied to the waveform shaping circuit 40 in FIG. 2 and the second power supply voltage VDDL2 supplied to the waveform shaping circuit 40 in FIG. 3 are set to higher voltages in the first mode than that in the second mode. In this manner, the phase noise of the clock signal CK output from the waveform shaping circuit 40 can be reduced, and the phase noise of the output clock signal CKQ of the circuit device 20 can also be reduced, so that the first mode which is the low noise mode can be implemented. It is desirable that the current flowing through the driving transistor of the oscillation circuit 30 in the first mode is larger than that in the second mode. It is desirable that the power supply voltage VDDL supplied to the oscillation circuit 30 in FIG. 2 and the first power supply voltage VDDL1 supplied to the oscillation circuit 30 in FIG. 3 in the first mode are larger than those in the second mode.

Figure 4:
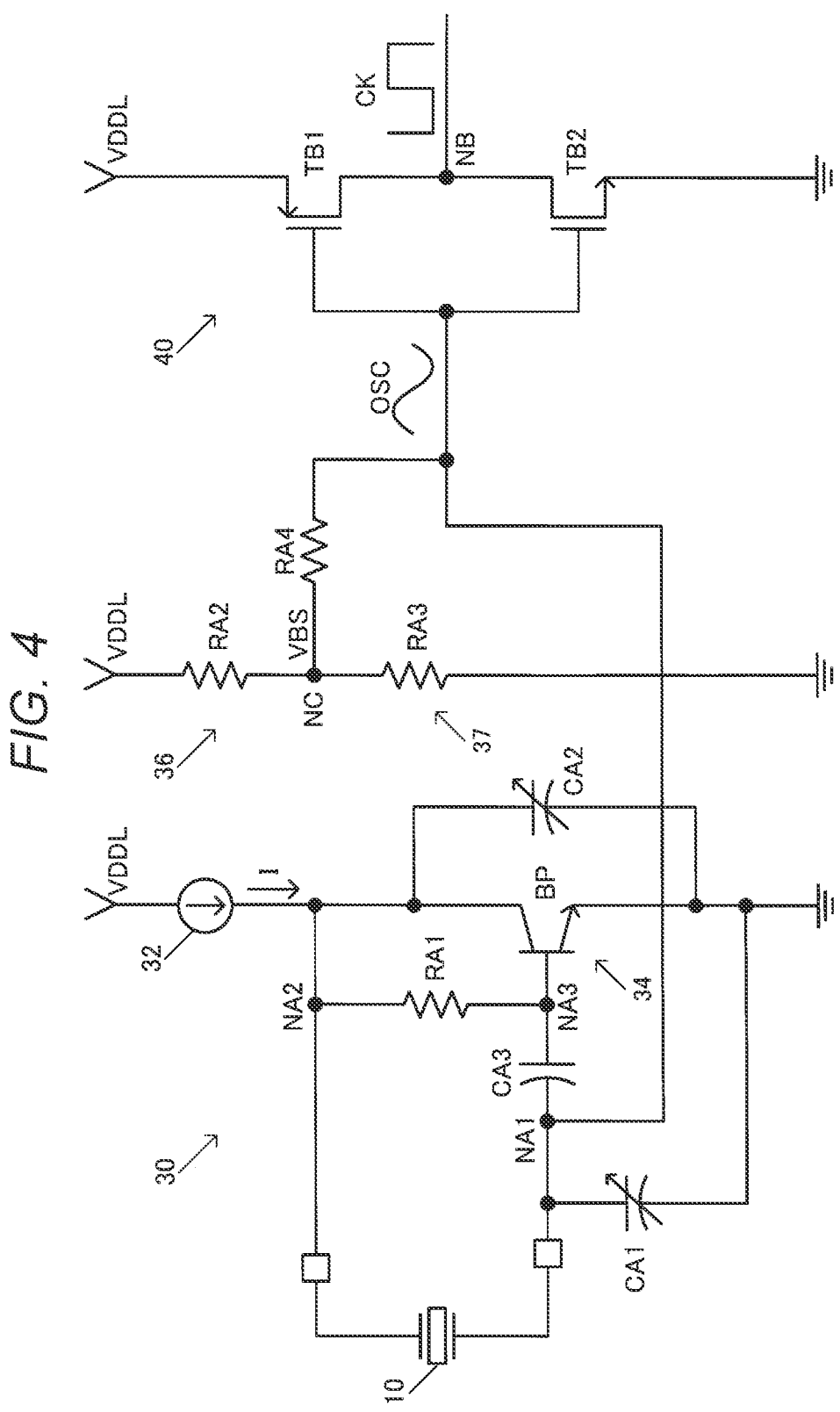
FIG. 4 shows a configuration example of an oscillation circuit and a waveform shaping circuit.

2. Noise Reduction According to Driving Capability of Waveform Shaping Circuit FIG. 4 shows a configuration example of the oscillation circuit 30 and the waveform shaping circuit 40. The oscillation circuit 30 and the waveform shaping circuit 40 are not limited to the configuration in FIG. 4, and various modifications can be made, such as omitting a part of components, adding other components, or replacing a part of components with other components.

The oscillation circuit 30 includes a current source 32 and the drive circuit 34. The oscillation circuit 30 may include variable capacitance circuits CAL and CA2, a capacitor CA3, and a resistor RA1.

The current source 32 and the drive circuit 34 are provided in series between a VDDL power supply node, which is a high-potential-side power supply node, and a GND node, which is a low-potential-side power supply node. The variable capacitance circuit CA1 is provided between a node NA1 to which one end of the resonator 10 is coupled and the GND node. The variable capacitance circuit CA2 is provided between a node NA2 to which the other one end of the resonator 10 is coupled and the GND node. By adjusting capacitances of the variable capacitance circuits CA1 and CA2, the oscillation frequency is adjusted, and a process of the temperature compensation performed on the oscillation frequency is implemented.

The drive circuit 34 includes a bipolar transistor BP. A collector of the bipolar transistor BP is coupled to a node NA2 which is a supply node of a current I of the current source 32, and an emitter is coupled to the GND node. A resistor RA1 is provided between the collector and a base. The capacitor CA3 is provided between a node NA3 of the base of the bipolar transistor BP and the node NA1. The capacitor CA3 is, for example, a DC-cut capacitor.

The current source 32 can be implemented by, for example, a current mirror circuit. The current mirror circuit supplies, to the drive circuit 34, the current I obtained by current-mirroring a reference current from a reference current generation circuit (not shown). The drive circuit 34 drives the resonator 10 based on the current I from the current source 32. The current source 32 is, for example, a variable current source, and supplies the variable current I to the drive circuit 34. The bipolar transistor BP of the drive circuit 34 drives the resonator 10 based on the variable current I. The current source 32 supplies, to the drive circuit 34, the current I larger than that in the second mode, in the first mode which is the low noise mode. Accordingly, the floor noise to be described later in the oscillation circuit 30 can be reduced, and the phase noise of the output clock signal CKQ can be reduced. On the other hand, the current source 32 supplies, to the drive circuit 34, the current I smaller than that in the first mode, in the second mode which is the low power consumption mode. Accordingly, the power consumption of the oscillation circuit 30 is reduced, and the power consumption of the circuit device 20 can be reduced.

The waveform shaping circuit 40 includes a P-type transistor TB1 and an N-type transistor TB2 that are provided in series between the VDDL power supply node, which is the high-potential-side power supply node, and the GND node. For example, a source of the transistor TB1 is coupled to the power supply node, and a source of the transistor TB2 is coupled to the GND node. Drains of the transistors TB1 and TB2 are coupled to a coupling node NB from which the clock signal CK is output. When the second power supply voltage VDDL2 is supplied to the waveform shaping circuit 40 as shown in FIG. 3, the power supply node is a VDDL2 node. The same applies to the following description. The oscillation signal OSC is input to gates of the transistors TB1 and TB2, and the sine wave oscillation signal OSC is subjected to the waveform shaping to obtain the rectangular wave clock signal CK by the buffer circuit of the waveform shaping circuit 40 including the transistors TB1 and TB2.

In FIG. 4, the reference voltage generation circuit 36 is provided. The reference voltage generation circuit 36 includes the ladder resistance circuit 37, and the ladder resistance circuit 37 includes a plurality of resistors RA2 and RA3 provided in series between the power supply node and the GND node. The bias voltage VBS is generated at a node NC by voltage division due to the resistors RA2 and RA3. For example, the bias voltage is set to VBS=VDDL/2. The reference voltage generation circuit 36 includes a resistor RA4 having one end coupled to the node NC which is a voltage division node. The bias voltage VBS of the oscillation signal OSC input to the waveform shaping circuit 40 is set by the reference voltage generation circuit 36, and the oscillation signal OSC whose center amplitude voltage is set to the bias voltage VBS is input to the waveform shaping circuit 40.

A DC-cut capacitor may be provided between a node of the gates of the transistors TB1 and TB2 of the waveform shaping circuit 40 and an input node of the oscillation signal OSC. In this manner, an AC component of the oscillation signal OSC is input to the waveform shaping circuit 40. In this case, for example, a feedback resistor that feeds back an output of the waveform shaping circuit 40 to an input may be provided, and the bias voltage by self-bias of the waveform shaping circuit 40 may be set to the center amplitude voltage of the oscillation signal OSC after the DC cut.

In FIG. 4, floor noise SWPM in the oscillation circuit 30 is expressed by the following Equation (1).

$$SWPM = 2FkT/PS \qquad (1)$$

F is a noise coefficient, k is a Boltzmann constant, and T is a temperature. PS is input power of the drive circuit 34 (bipolar transistor BP) of the oscillation circuit 30, and correlates with the amplitude of the oscillation signal OSC. For example, when the current I supplied to the drive circuit 34 of the oscillation circuit 30 in the first mode is set to be larger than that in the second mode, the input power PS is increased as shown in the above Equation (1), so that SWPM which is the floor noise in the oscillation circuit 30 can be reduced. Accordingly, the phase noise of the clock signal CK can be reduced, and the phase noise of the output clock signal CKQ can be reduced.

Figure 5:
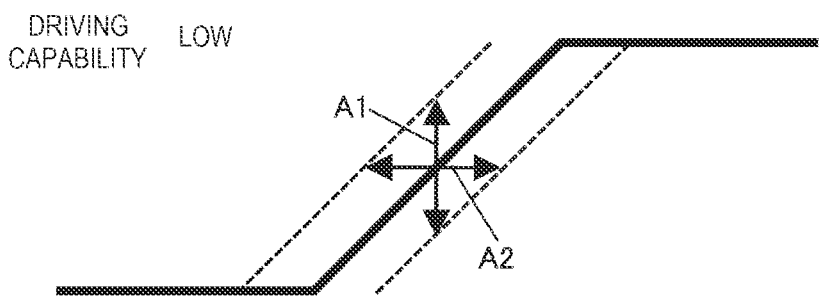
FIG. 5 shows a relationship between a driving capability of the waveform shaping circuit and phase noise.
Figure 5:
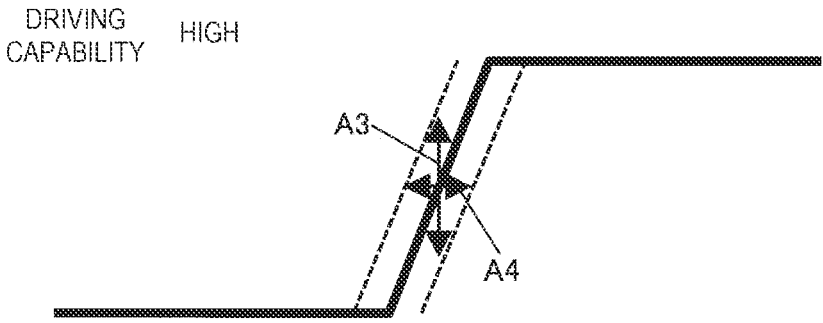

For example, the phase noise of the clock signal CK in the waveform shaping circuit 40 is generated due to the floor noise in the oscillation circuit 30, the noise of the power supply voltage VDDL, the noise generated by the transistors TB1 and TB2 of the waveform shaping circuit 40, and the like. For example, FIG. 5 is a diagram showing conversion from a voltage noise to the phase noise at the time of the waveform shaping performed by the waveform shaping circuit 40. As shown in FIG. 5, when a driving capability of the waveform shaping circuit 40 is low, voltage noise indicated by A1 is converted into large phase noise as indicated by A2. On the other hand, when the driving capability of the waveform shaping circuit 40 is high, phase noise indicated by A4 converted from the voltage noise indicated by A3 is smaller than the phase noise indicated by A2 when the driving capability is low. The voltage noise of A1 and A3 is, for example, noise caused by power supply noise or noise of the transistors TB1 and TB2, and the floor noise in the waveform shaping circuit 40 is converted into phase noise before being input to the waveform shaping circuit 40.

In this manner, by improving the driving capability of the waveform shaping circuit 40 in the first mode, it is possible to reduce the phase noise caused by voltage noise or the like, and it is possible to implement the first mode which is the low noise mode.

Figure 6:
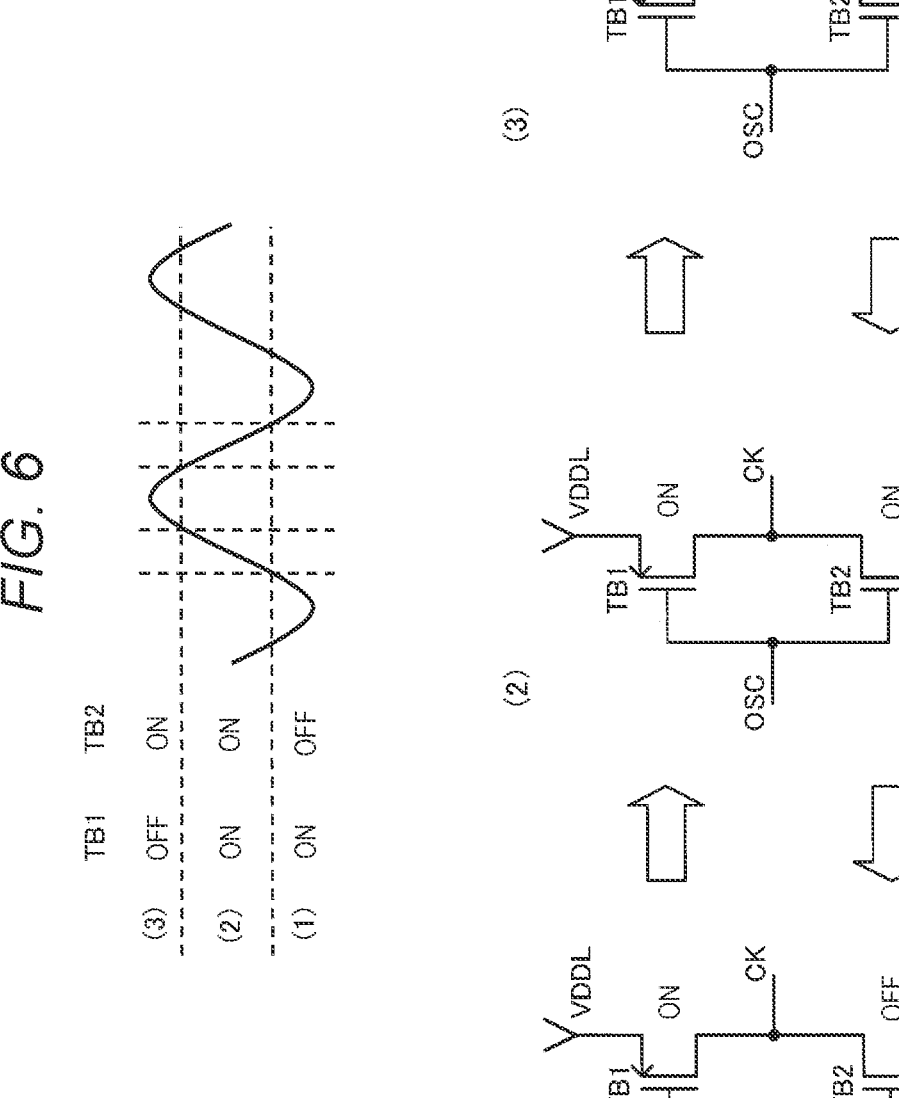
FIG. 6 is a diagram showing on and off states of a transistor in the waveform shaping circuit.

For example, FIG. 6 is a diagram showing a relationship between a voltage level of the oscillation signal OSC and on and off states of the transistors TB1 and TB2 of the waveform shaping circuit 40. When the voltage level of the oscillation signal OSC is in a voltage range of (1) in FIG. 6, the P-type transistor TB1 is turned on, and the N-type transistor TB2 is turned off. Further, when the voltage level of the oscillation signal OSC is in a voltage range of (2), both the P-type transistor TB1 and the N-type transistor TB2 are turned on. Further, when the voltage level of the oscillation signal OSC is in a voltage range of (3), the P-type transistor TB1 is turned off, and the N-type transistor TB2 is turned on. In a period in which both the transistors TB1 and TB2 are turned on as shown in (2) of FIG. 6, a through current flows from the power supply node to the GND node, and noise from the power supply is propagated as the phase noise. For example, when a through current exceeding a current supply capacity of the power supply circuit 90 flows, an effect of reducing the power supply noise caused by the regulator of the power supply circuit 90 is lost, and the power supply noise is propagated as the phase noise instead of being reduced.

In this regard, in the embodiment, the driving capability of the waveform shaping circuit 40 is improved in the first mode. In this manner, the period during which both the transistors TB1 and TB2 are turned on as in (2) of FIG. 6 can be shortened in time. By shortening the period during which both the transistors TB1 and TB2 are turned on in this manner, it is possible to reduce the phase noise caused by the power supply noise, and it is possible to implement the noise reduction of the output clock signal CKQ.

Figure 7:
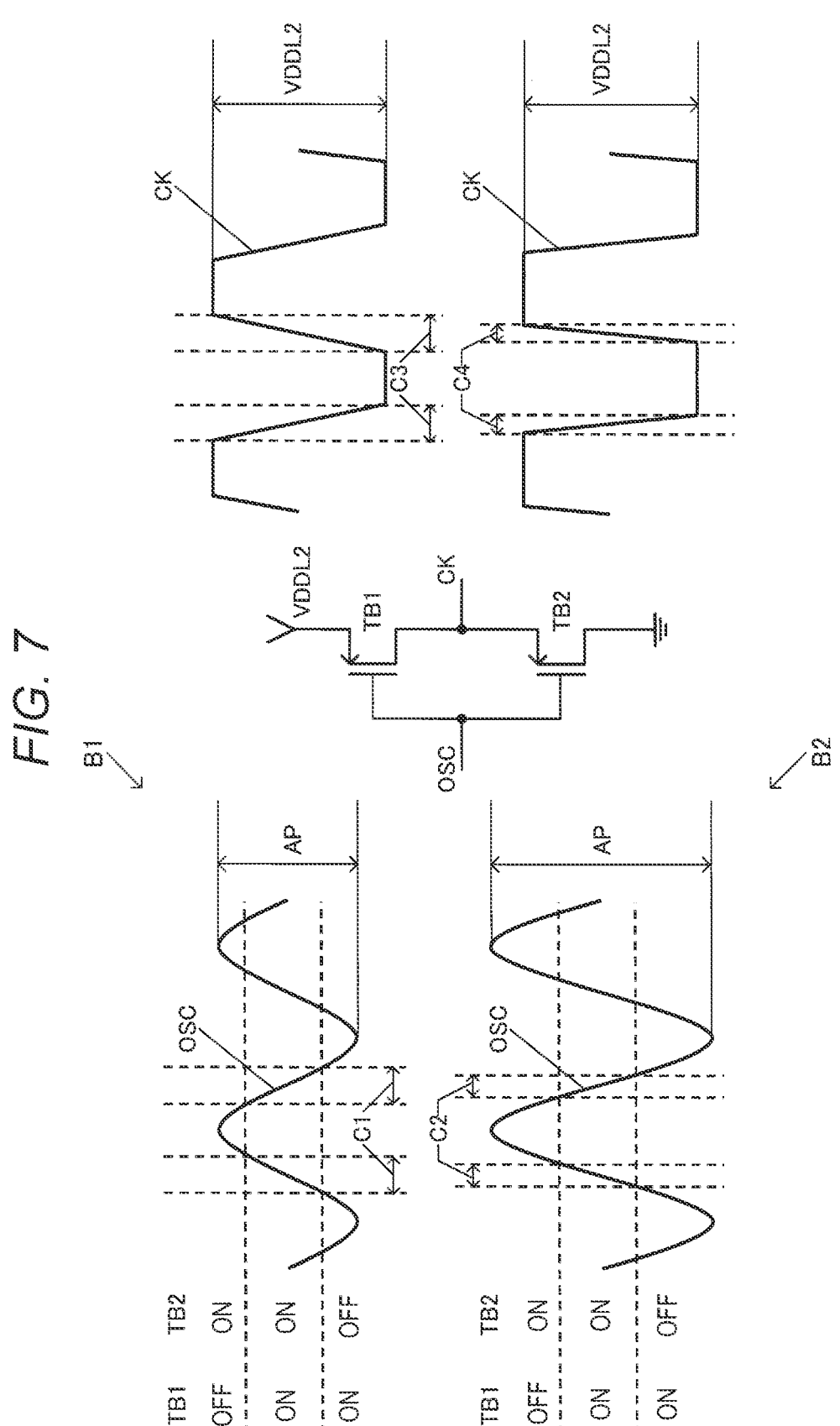
FIG. 7 is a diagram showing a method of differentiating an oscillation amplitude and a power supply voltage of the waveform shaping circuit.

FIG. 7 is a diagram showing a method of differentiating the first power supply voltage VDDL1 supplied to the oscillation circuit 30 and the second power supply voltage VDDL2 supplied to the waveform shaping circuit 40 as shown in FIG. 3. In B2 of FIG. 7, an amplitude AP of the oscillation signal OSC is larger than that in B1. For example, the amplitude AP is increased to be larger than the second power supply voltage VDDL2 of the waveform shaping circuit 40. That is, a peak-to-peak voltage of the oscillation signal OSC is increased to be larger than the second power supply voltage VDDL2. For example, the amplitude AP of the oscillation signal OSC can be increased by increasing the first power supply voltage VDDL1 supplied to the oscillation circuit 30. By increasing the amplitude AP in this manner, it is possible to shorten the period in which both the transistors TB1 and TB2 of the waveform shaping circuit 40 are turned on as indicated by C2, as compared with a case in which the amplitude AP indicated by C1 is small. Even in a transition period in which the clock signal CK transitions from an L level to an H level or from the H level to the L level, the transition period is shortened as indicated by C4 by increasing the amplitude AP as compared with C3 of a case in which the amplitude AP is small. By shortening the periods indicated by C2 and C4, as in the case of FIG. 5, it is possible to reduce the phase noise caused by the power supply noise, and it is possible to implement the noise reduction of the output clock signal CKQ.

As described above, the circuit device 20 or the oscillator 4 according to the embodiment can perform switching between the first mode with low phase noise and the second mode with low power consumption. The circuit device 20 includes the oscillation circuit 30 that generates the oscillation signal OSC, the waveform shaping circuit 40 that performs the waveform shaping on the oscillation signal OSC to obtain the rectangular wave clock signal CK, and the output circuit 80 that outputs the output clock signal CKQ based on the clock signal CK. In the embodiment, a driving capability of the waveform shaping circuit 40 in the first mode is higher than a driving capability of the waveform shaping circuit 40 in the second mode. For example, in the first mode, the driving capability of the waveform shaping circuit 40 is increased by setting sizes of the transistors TB1 and TB2 of the waveform shaping circuit 40 to sizes larger than those in the second mode, or by increasing the power supply voltage VDDL or the second power supply voltage VDDL2 supplied to the waveform shaping circuit 40. By increasing the driving capability of the waveform shaping circuit 40 in the first mode in this manner, it is possible to reduce the phase noise of the clock signal CK caused by the power supply noise, the noise of the transistor, and the like as described in FIG. 5 and the like, and it is possible to output the output clock signal CKQ in which the phase noise is reduced.

In the embodiment, the power supply voltage VDDL supplied to the waveform shaping circuit 40 in the first mode is larger than the power supply voltage VDDL supplied to the waveform shaping circuit 40 in the second mode. By increasing the power supply voltage VDDL supplied to the waveform shaping circuit 40 in the first mode in this manner, the driving capability of the waveform shaping circuit 40 in the first mode can be increased. Accordingly, it is possible to shorten the period during which both the transistors TB1 and TB2 of the waveform shaping circuit 40 are turned on in FIG. 6, it is possible to reduce the phase noise of the clock signal CK caused by the power supply noise and the noise of the transistors, and it is possible to implement the first mode which is the low noise mode. When the power supply voltages of the oscillation circuit 30 and the waveform shaping circuit 40 are made different from each other as shown in FIG. 3, the second power supply voltage VDDL2 supplied to the waveform shaping circuit 40 in the first mode may be made higher than that in the second mode.

In the embodiment, the power supply voltage VDDL supplied to the oscillation circuit 30 in the first mode is larger than the power supply voltage VDDL supplied to the oscillation circuit 30 in the second mode. By increasing the power supply voltage VDDL of the oscillation circuit 30 in the first mode in this manner, the amplitude of the oscillation signal OSC can be increased, and the noise reduction can be implemented. For example, by increasing the amplitude of the oscillation signal OSC, it is possible to shorten the period during which both the transistors TB1 and TB2 of the waveform shaping circuit 40 described in FIG. 7 are turned on, and it is possible to reduce the phase noise caused by power supply noise or the like. Further, by increasing the amplitude of the oscillation signal OSC, an influence of the floor noise can be reduced, and the first mode which is the low noise mode can be implemented.

In the embodiment, as shown in FIG. 4, the oscillation circuit 30 includes the current source 32 and the drive circuit 34 to which the current I from the current source 32 is supplied to drive the resonator 10. The current I supplied from the current source 32 to the drive circuit 34 in the first mode is larger than the current I supplied from the current source 32 to the drive circuit 34 in the second mode. For example, the current source 32 can be implemented by the current mirror circuit that supplies the current I obtained by current-mirroring the reference current. In the first mode, the current I supplied from the current source 32 is increased by increasing the reference current or increasing a current mirror ratio as compared with the second mode. By increasing the current supplied from the current source 32 to the drive circuit 34 in the first mode in this manner, the input power PS to the drive circuit 34 can be increased as described in the above Equation (1), and the floor noise in the oscillation circuit 30 can be reduced. By reducing the floor noise of the oscillation circuit 30, the noise of the oscillation signal OSC is reduced, the phase noise of the clock signal CK and the output clock signal CKQ generated based on the oscillation signal OSC can be reduced, and the first mode which is the low noise mode can be implemented.

In the embodiment, as shown in FIG. 3, the oscillation circuit 30 operates by being supplied with the first power supply voltage VDDL1, and the waveform shaping circuit 40 operates by being supplied with the second power supply voltage VDDL2 different from the first power supply voltage VDDL1. For example, the first power supply voltage VDDL1 and the second power supply voltage VDDL2 can be adjusted separately. For example, the regulators 91 and 92 in FIG. 3 include an operational amplifier whose first input terminal receives the reference voltage and which controls a gate of a drive transistor, and a resistance division circuit provided between a node of a drain of the drive transistor and the GND node. A division voltage of an output voltage of the drive transistor from the resistance division circuit is fed back to a second input terminal of the operational amplifier. By adjusting a resistance ratio of the resistance division voltage, the voltage of the first power supply voltage VDDL1 output from the regulator 91 and the voltage of the second power supply voltage VDDL2 output from the regulator 92 can be adjusted. Since the first power supply voltage VDDL1 supplied to the oscillation circuit 30 and the second power supply voltage VDDL2 supplied to the waveform shaping circuit 40 can be adjusted separately in this manner, it is possible to finely adjust the first mode which is the low noise mode and the second mode which is the low power consumption mode. For example, in the first mode, the first power supply voltage VDDL1 of the oscillation circuit 30 and the second power supply voltage VDDL2 of the waveform shaping circuit 40 are increased, but it is possible to adjust each voltage of the first power supply voltage VDDL1 and the second power supply voltage VDDL2 separately, so that the noise is reduced. In addition, in the second mode, the first power supply voltage VDDL1 of the oscillation circuit 30 and the second power supply voltage VDDL2 of the waveform shaping circuit 40 are decreased, but it is possible to adjust each voltage of the first power supply voltage VDDL1 and the second power supply voltage VDDL2 separately, so that the power consumption is reduced.

In the embodiment, the waveform shaping circuit 40 is supplied with the second power supply voltage VDDL2 smaller than the amplitude of the oscillation signal OSC and operates. That is, as described in FIG. 7, the second power supply voltage VDDL2 is adjusted, so that the second power supply voltage VDDL2 becomes smaller than the amplitude AP of the oscillation signal OSC. This adjustment can be implemented by adjusting the resistance ratio or the like of the resistance division circuit of the regulator 92. In this manner, the oscillation signal OSC having an amplitude larger than the second power supply voltage VDDL2 of the waveform shaping circuit 40 is input to the waveform shaping circuit 40, and the period during which both the transistors TB1 and TB2 of the waveform shaping circuit 40 are turned on can be shortened. Accordingly, the phase noise of the clock signal CK caused by the power supply noise or the like can be reduced, and the first mode which is the low noise mode can be implemented.

3. Waveform Shaping Circuit and Oscillation Circuit

Figure 8:
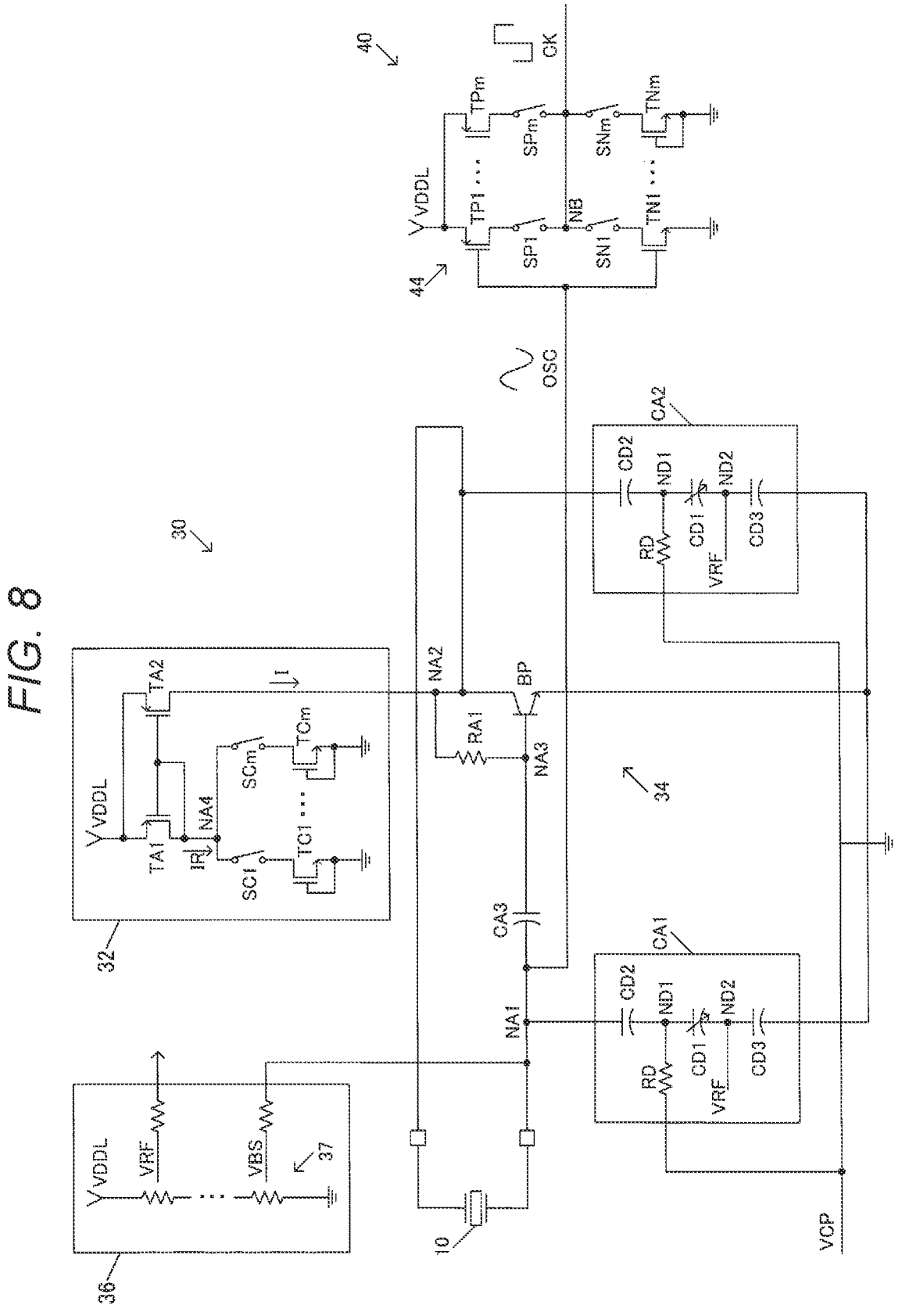
FIG. 8 shows a detailed configuration example of the oscillation circuit and the waveform shaping circuit.

FIG. 8 shows a detailed configuration example of the waveform shaping circuit 40 and the oscillation circuit 30. As shown in FIG. 8, the current source 32 of the oscillation circuit 30 includes a current mirror circuit including transistors TA1 and TA2. Sources of the P-type transistors TA1 and TA2 are coupled to the power supply node, and gates thereof are commonly coupled to a node NA4. The current I obtained by the current mirror circuit current-mirroring the reference current IR is supplied from the current source 32 to the drive circuit 34. For example, a plurality of switches SC1 to SCm and a plurality of transistors TC1 to TCm are provided between the node NA4 and the GND node, and the reference current IR is generated by the switches and the transistors. Here, m is an integer of 2 or more. The switches SC1 to SCm and the transistors TC1 to TCm are provided in series between the node NA4 and the GND node. The switches SC1 to SCm can be implemented by, for example, transistors that are turned on or off by a control signal from the control circuit 60. The transistors TC1 to TCm are implemented by, for example, N-type depletion type transistors, and gates and sources thereof are coupled. In the first mode, the number of switches SC1 to SCm to be turned on is larger than that in the second mode. In this manner, in the first mode, the reference current IR is larger than that in the second mode, and the current I supplied from the current source 32 to the drive circuit 34 is also increased. Accordingly, the first mode, which is the low noise mode, can be implemented. On the other hand, in the second mode, the number of the switches SC1 to SCm to be turned on is smaller than that in the second mode, and accordingly, the second mode, which is the low power consumption mode, can be implemented.

Each of the variable capacitance circuits CA1 and CA2 includes a variable capacitance element CD1, capacitors CD2 and CD3, and a resistor RD. The capacitor CD2 has one end coupled to the node NA1 or the node NA2 and the other end coupled to a node ND1. The temperature compensation voltage VCP from the temperature compensation circuit 70 of FIGS. 2 and 3 is supplied to the node ND1 via the resistor RD. The variable capacitance element CD1 has one end coupled to the node ND1 and the other end coupled to a node ND2. The reference voltage VRF from the reference voltage generation circuit 36 is supplied to the node ND2. The capacitor CD3 is provided between the node ND2 and the GND node. Capacitances of the variable capacitance elements CD1 of the variable capacitance circuits CA1 and CA2 are adjusted by the temperature compensation voltage VCP, thereby implementing the process of the temperature compensation.

The waveform shaping circuit 40 includes a buffer circuit 44. The buffer circuit 44 performs the waveform shaping on the input oscillation signal OSC and outputs the clock signal CK. The buffer circuit 44 includes a plurality of P-type transistors TP1 to TPm and a plurality of P-side switches SP1 to SPm. The plurality of P-type transistors TP1 to TPm and the plurality of P-side switches SP1 to SPm are coupled in series between the power supply node and the coupling node NB. The buffer circuit 44 further includes a plurality of N-type transistors TN1 to TNm and a plurality of N-side switches SN1 to SNm. The plurality of N-type transistors TN1 to SNm and the plurality of the N-side switches SN1 to SNm are coupled in series between the coupling node NB and the GND node. The plurality of P-type transistors TP1 to TPm correspond to the P-type transistor TB1 in FIG. 4, and the plurality of N-type transistors TN1 to TNm correspond to the N-type transistor TB2. That is, each of the transistors TB1 and TB2 of the waveform shaping circuit 40 is divided into a plurality of unit transistors.

In the embodiment, the number of the P-side switches SP1 to SPm and the N-side switches SN1 to SNm that are turned on in the first mode is larger than the number of the P-side switches SP1 to SPm and the N-side switches SN1 to SNm that are turned on in the second mode. For example, the switches SP1 to SPm and SN1 to SNm are turned on and off based on a control signal from the control circuit 60, and are controlled such that the number of switches that are turned on in the first mode is larger than that in the second mode. In this manner, the number of P-type transistors coupled in parallel between the power supply node and the coupling node NB and the number of N-type transistors coupled in parallel between the coupling node NB and the GND node in the first mode are controlled to be larger than that in the second mode. That is, the resistances of the transistors TB1 and TB2 in FIG. 4 can be reduced in the first mode. Accordingly, the driving capability of the waveform shaping circuit 40 in the first mode can be improved as compared with that in the second mode, and the phase noise caused by the power supply noise or the like can be reduced.

Figure 9:
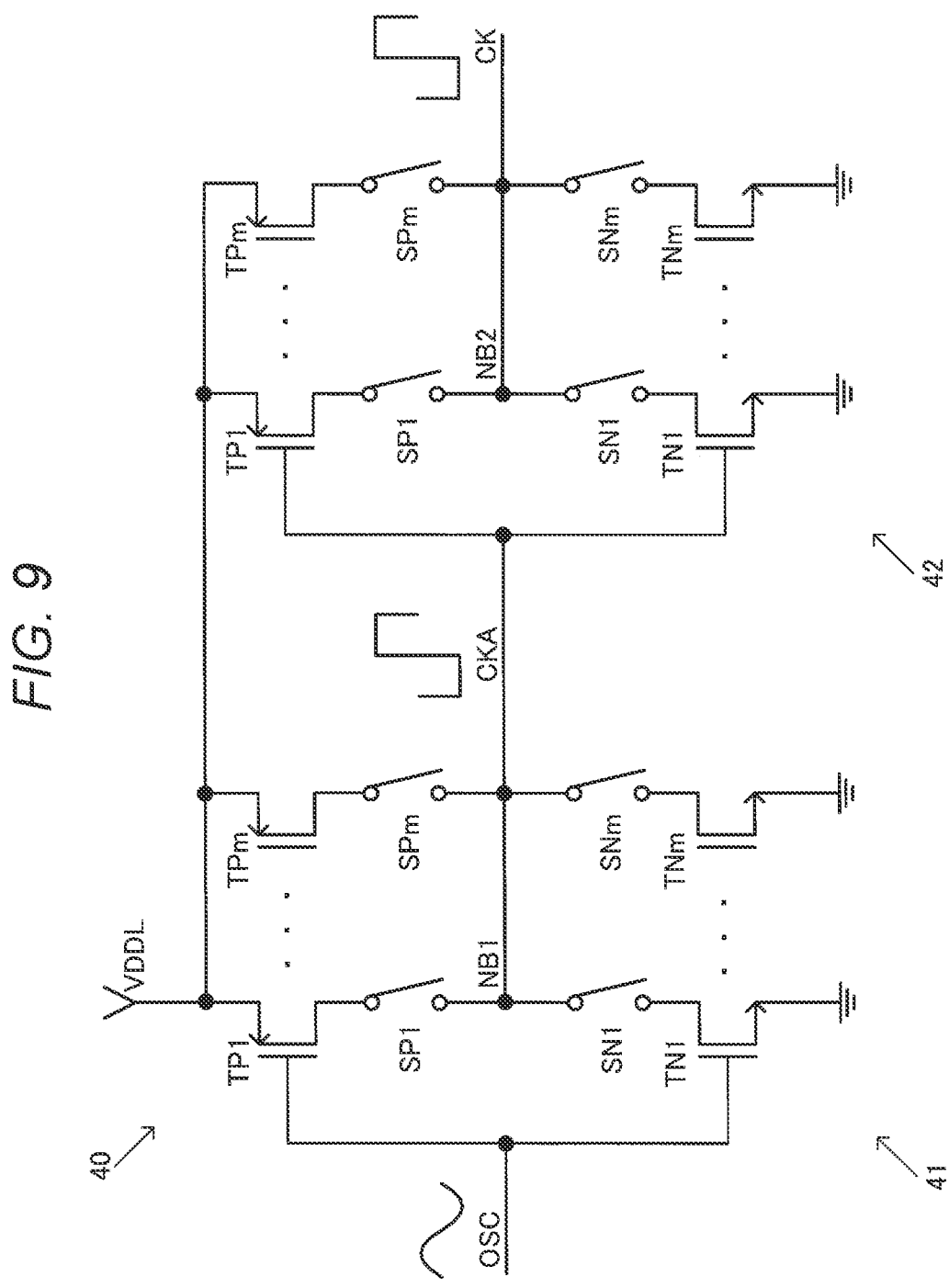
FIG. 9 shows another detailed configuration example of the waveform shaping circuit.

FIG. 9 shows another configuration example of the waveform shaping circuit 40. The waveform shaping circuit 40 of FIG. 9 includes a first buffer circuit 41 and a second buffer circuit 42 provided at a stage subsequent to the first buffer circuit 41. For example, the oscillation signal OSC is input to the first buffer circuit 41, and a signal CKA subjected to the waveform shaping performed by the first buffer circuit 41 is input to the second buffer circuit 42. The signal subjected to the waveform shaping performed by the second buffer circuit 42 is output as the clock signal CK. In this manner, in FIG. 9, the waveform shaping is performed by a plurality of buffer circuits. The number of buffer circuits in the waveform shaping circuit 40 may be three or more.

In FIG. 9, each of the first buffer circuit 41 and the second buffer circuit 42 includes the plurality of P-type transistors TP1 to TPm and the plurality of P-side switches SP1 to SPm. The plurality of P-type transistors TP1 to TPm and the plurality of P-side switches SP1 to SPm are coupled in series between the power supply node and the coupling node NB1 or NB2. Each buffer circuit further includes a plurality of N-type transistors TN1 to TNm and a plurality of N-side switches SN1 to SNm. The plurality of N-type transistors TN1 to TNm and the plurality of the N-side switches SN1 to SNm are coupled in series between the coupling node NB1 or NB2 and the GND node.

In each of the first buffer circuit 41 and the second buffer circuit 42, the number of the P-side switches SP1 to SPm and the N-side switches SN1 to SNm that are turned on in the first mode is larger than the number of the P-side switches SP1 to SPm and the N-side switches SN1 to SNm that are turned on in the second mode. In this manner, in each buffer circuit, the number of P-type transistors coupled in parallel between the power supply node and the coupling node NB1 or NB2 and the number of N-type transistors coupled in parallel between the coupling node NB1 or NB2 and the GND node in the first mode are controlled to be larger than that in the second mode. Accordingly, the driving capability of each buffer circuit of the waveform shaping circuit 40 in the first mode can be improved as compared with that in the second mode, and the phase noise caused by the power supply noise or the like can be reduced. As shown in FIG. 9, a plurality of buffer circuits such as the first buffer circuit 41 and the second buffer circuit 42 are provided, so that the driving capability of each buffer circuit of the plurality of buffer circuits can be adjusted, and it is possible to adjust a balance between the noise reduction and the low power consumption. In this case, the driving capabilities of the plurality of buffer circuits may be individually switched or may be switched in conjunction with each other. That is, as the on and off control signals of the switches SP1 to SPm and the switches SN1 to SNm of the first buffer circuit 41 and the second buffer circuit 42, individual control signals may be used or a common control signal may be used.

4. Adjustment of Driving Capability of Output Circuit

Figure 10:
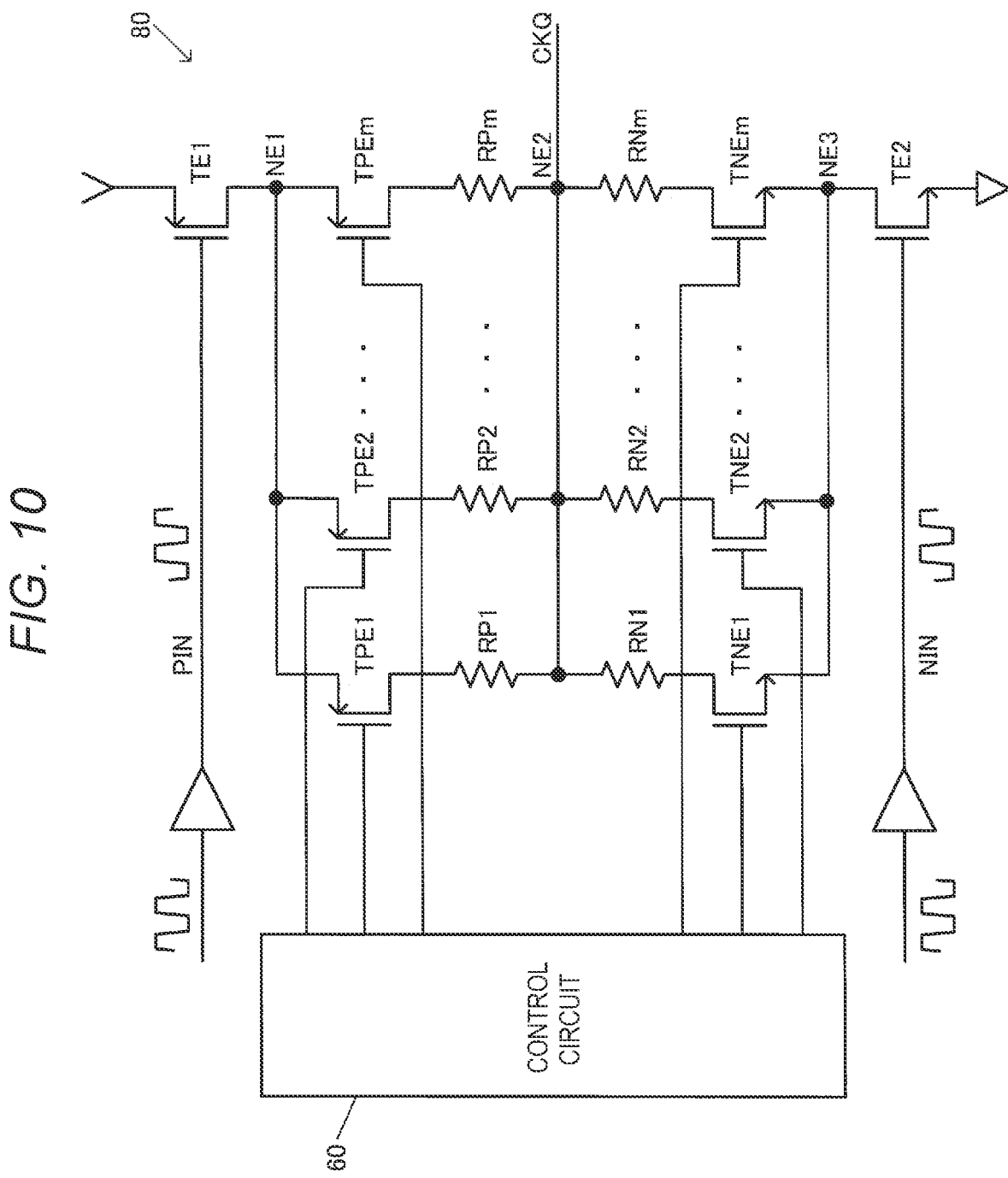
FIG. 10 shows a configuration example of an output circuit.

As described above, in the embodiment, the first mode and the second mode are implemented by adjusting the driving capability of the waveform shaping circuit 40. In this case, in addition to the adjustment of the driving capability of the waveform shaping circuit 40, the driving capability of the output circuit 80 may be adjusted. FIG. 10 shows a configuration example of the output circuit 80 capable of adjusting the driving capability as described above. In FIG. 10, the driving capability of the output circuit 80 in the first mode, which is the low noise mode, is higher than the driving capability of the output circuit 80 in the second mode.

Specifically, the output circuit 80 of FIG. 10 includes a transistor TE1, transistors TPE1 to TPEm, transistors TNE1 to TNEm, and a transistor TE2. The TEL and TPE1 to TPEm are, for example, the P-type transistors, and the TNE1 to TNEm and TE2 are, for example, the N-type transistors. The output circuit 80 includes P-side resistors RP1 to RPm and N-side resistors RN1 to RNm. The resistors RP1 to RPm and RN1 to RNm can also serve as, for example, a resistor for electrostatic protection of the output circuit 80.

A source of the transistor TEL is coupled to the power supply node, and a P-side signal PIN based on the clock signal CK or the clock signal CKD is input to a gate of the transistor TE1. The transistors TPE1 to TPEm and the resistors RP1 to RPm are provided between a node NE1 of a drain of the transistor TEL and a node NE2 of an output of the output circuit 80. The transistors TPE1 to TPEm and the resistors RP1 to RPm are provided in series between the nodes NE1 and NE2. In addition, a control signal from the control circuit 60 is input to the gates of the transistors TPE1 to TPEm, and on and off of the transistors TPE1 to TPEm are controlled.

A source of the transistor TE2 is coupled to the GND node, and a N-side signal NIN based on the clock signal CK or the clock signal CKD is input to a gate of the transistor TE2. The resistors RN1 to RNm and the transistors TNE1 to TNEm are provided between the node NE2 and a node NE3 of a drain of the transistor TE2. The resistors RN1 to RNm and the transistors TNE1 to TNEm are provided in series between the node NE2 and the node NE3. In addition, a control signal from the control circuit 60 is input to the gates of the transistors TNE1 to TNEm, and on and off of the transistors TNE1 to TNEm are controlled.

In the embodiment, the number of the transistors TPE1 to TPEm and the number of the transistors TNE1 to TNEm that are turned on in the first mode are larger than the number of the transistors TPE1 to TPEm and the number of the transistors TNE1 to TNEm that are turned on in the second mode. As described above, in the first mode, since the number of transistors that are turned on is increased, a larger number of resistors among the resistors RP1 to RPm and RN1 to RNm are coupled in parallel, and it is possible to reduce a resistance value between the node NE1 and the node NE2 and a resistance value between the node NE2 and the node NE3. Accordingly, in the first mode, the driving capability of the output circuit 80 is improved as compared with that in the second mode, and a slope of a waveform of the output clock signal CKQ when an external load is driven becomes steeper and approaches vertical. Accordingly, for the same reason as in the case of FIG. 5, the phase noise of the output clock signal CKQ caused by the power supply noise or the like can be reduced, and the first mode which is the low noise mode can be implemented. On the other hand, in the second mode, as the number of transistors that are turned on decreases, the driving capability of the output circuit 80 decreases, and the slope of the waveform of the output clock signal CKQ decreases and becomes flat. In this manner, by adjusting the driving capability of the output circuit 80 in addition to the driving capability of the waveform shaping circuit 40, it is possible to further adjust the noise reduction and the low power consumption.

In FIG. 10, the driving capability is adjusted by changing a size of a transistor of an output stage of the output circuit 80, but the driving capability may be adjusted by changing the power supply voltage supplied to the output circuit 80. In FIG. 10, the P-type transistor is used as the transistor TE1 to which the signal PIN is input, but the N-type transistor may also be used. For example, when the output clock signal CKQ is output as a differential clock signal, an output of an open drain may be performed using the N-type transistor as the transistor TE1.

As described above, the circuit device according to the embodiment is a circuit device configured to switching between a first mode in which phase noise of an output clock signal is lower than that in a second mode and the second mode in which power consumption is smaller than that in the first mode. The circuit device includes an oscillation circuit configured to generate an oscillation signal, a waveform shaping circuit configured to perform waveform shaping on the oscillation signal to obtain a rectangular wave clock signal, and an output circuit configured to output the output clock signal based on the clock signal. A driving capability of the waveform shaping circuit in the first mode is higher than a driving capability of the waveform shaping circuit in the second mode.

In the embodiment, the circuit device can perform switching between the first mode with low phase noise and the second mode with low power consumption. In the embodiment, the oscillation signal is generated, and the output clock signal based on the clock signal generated by the waveform shaping circuit performing the waveform shaping on the oscillation signal is output. The driving capability of the waveform shaping circuit in the first mode is higher than that in the second mode. In this manner, the phase noise of the clock signal output from the waveform shaping circuit can be reduced, and the phase noise of the output clock signal of the circuit device can also be reduced, so that the first mode which is the low noise mode can be implemented.

In the embodiment, the waveform shaping circuit may include a buffer circuit. The buffer circuit may include a plurality of P-type transistors and a plurality of P-side switches in which each P-type transistor and each P-side switch are coupled in series between a power supply node and a coupling node, and a plurality of N-type transistors and a plurality of N-side switches in which each N-type transistor and each N-side switch are coupled in series between the coupling node and a GND node. The number of the P-side switches and the N-side switches that are turned on in the first mode may be larger than the number of the P-side switches and the N-side switches that are turned on in the second mode.

In this manner, the number of P-type transistors coupled in parallel between the power supply node and the coupling node and the number of N-type transistors coupled in parallel between the coupling node and the GND node in the first mode are larger than that in the second mode. Accordingly, the driving capability of the waveform shaping circuit in the first mode can be improved as compared with that in the second mode.

In the embodiment, the waveform shaping circuit may include a first buffer circuit and a second buffer circuit provided at a stage subsequent to the first buffer circuit. Each buffer circuit of the first buffer circuit and the second buffer circuit may include a plurality of P-type transistors and a plurality of P-side switches in which each P-type transistor and each P-side switch are coupled in series between a power supply node and a coupling node, and a plurality of N-type transistors and a plurality of N-side switches in which each N-type transistor and each N-side switch are coupled in series between the coupling node and a GND node. The number of the P-side switches and the N-side switches that are turned on in the first mode may be larger than the number of the P-side switches and the N-side switches that are turned on in the second mode.

In this manner, in each buffer circuit, the number of P-type transistors coupled in parallel between the power supply node and the coupling node and the number of N-type transistors coupled in parallel between the coupling node and the GND node in the first mode are larger than that in the second mode. Accordingly, the driving capability of the waveform shaping circuit in the first mode can be improved as compared with that in the second mode.

In the embodiment, a power supply voltage supplied to the waveform shaping circuit in the first mode may be larger than the power supply voltage supplied to the waveform shaping circuit in the second mode.

By increasing the power supply voltage supplied to the waveform shaping circuit in the first mode in this manner, the driving capability of the waveform shaping circuit in the first mode can be increased, and for example, the phase noise can be reduced.

In the embodiment, a power supply voltage supplied to the oscillation circuit in the first mode may be larger than the power supply voltage supplied to the oscillation circuit in the second mode.

By increasing the power supply voltage of the oscillation circuit in the first mode in this manner, the amplitude of the oscillation signal can be increased, and the noise reduction can be implemented.

In the embodiment, the oscillation circuit may include a current source and a drive circuit to which a current from the current source is supplied to drive a resonator. The current supplied from the current source to the drive circuit in the first mode is larger than the current supplied from the current source to the drive circuit in the second mode.

By increasing the current supplied from the current source to the drive circuit in the first mode in this manner, the floor noise in the oscillation circuit can be reduced, and the noise of the oscillation signal can be reduced.

In the embodiment, the oscillation circuit may operate by being supplied with a first power supply voltage, and the waveform shaping circuit may operate by being supplied with a second power supply voltage different from the first power supply voltage.

In this manner, the first power supply voltage supplied to the oscillation circuit and the second power supply voltage supplied to the waveform shaping circuit can be adjusted separately, it is possible to finely adjust the first mode which is the low noise mode and the second mode which is the low power consumption mode.

In addition, in the embodiment, the waveform shaping circuit may operate by being supplied with the second power supply voltage smaller than an amplitude of the oscillation signal.

In this manner, the oscillation signal having the amplitude larger than the second power supply voltage of the waveform shaping circuit is input to the waveform shaping circuit, so that the phase noise of the clock signal caused by the power supply noise or the like can be reduced.

In the embodiment, a driving capability of the output circuit in the first mode is higher than a driving capability of the output circuit in the second mode.

In this manner, by adjusting the driving capability of the output circuit in addition to the driving capability of the waveform shaping circuit, it is possible to further adjust the noise reduction and the low power consumption.

The oscillator according to the embodiment is an oscillator configured to switching between a first mode in which phase noise of an output clock signal is lower than that in a second mode and the second mode in which power consumption is smaller than that in the first mode. The oscillator includes a resonator and a circuit device. The circuit device includes an oscillation circuit configured to oscillate the resonator to generate an oscillation signal, a waveform shaping circuit configured to perform waveform shaping on the oscillation signal to obtain a rectangular wave clock signal, and an output circuit configured to output the output clock signal based on the clock signal. A driving capability of the waveform shaping circuit in the first mode is higher than a driving capability of the waveform shaping circuit in the second mode.

In this manner, the phase noise of the clock signal output from the waveform shaping circuit can be reduced, and the phase noise of the output clock signal of the circuit device can also be reduced, so that the first mode which is the low noise mode can be implemented.

Although the embodiment has been described in detail above, it can be easily understood by those skilled in the art that many modifications can be made without substantially departing from the novel matters and effects of the present disclosure. Accordingly, all such modifications are within the scope of the present disclosure. For example, a term described at least once together with a different term having a broader meaning or the same meaning in the description or the drawings can be replaced with the different term at any place in the description or the drawings. All combinations of the embodiment and the modifications are also included in the scope of the disclosure. The configurations, operations, and the like of the circuit device and the oscillator are not limited to those described in the embodiment, and various modifications can be made.

What is claimed is:

1. A circuit device configured to switch between a first mode in which phase noise of an output clock signal is lower than that in a second mode and the second mode in which power consumption is smaller than that in the first mode, the circuit device comprising:

a power supply circuit configured to generate a first power supply voltage and a second power supply voltage, the first power supply voltage has a first voltage value and a second voltage value that is higher than the first voltage value, the second voltage value of the first power supply voltage being higher than a value of the second power supply voltage;

an oscillation circuit configured to receive one of the first and second voltage values of the first power supply voltage and generate an oscillation signal;

a waveform shaping circuit configured to receive the second power supply voltage and perform waveform shaping on the oscillation signal to obtain a rectangular wave clock signal; and an output circuit configured to output the output clock signal based on the clock signal, wherein the power supply circuit is further configured to supply the second voltage value of the first power supply voltage to the oscillation circuit to increase an amplitude of the oscillation signal which corresponds to the second voltage value, such that a transition period between a low level and a high level in the first mode is shortened than the second mode when performing the waveform shaping on the oscillation signal to obtain the rectangular wave clock signal.

2. The circuit device according to claim 1, wherein the waveform shaping circuit includes a buffer circuit, the buffer circuit includes:

a plurality of P-type transistors and a plurality of P-side switches in which each P-type transistor and each P-side switch are coupled in series between a power supply node and a coupling node; and a plurality of N-type transistors and a plurality of N-side switches in which each N-type transistor and each N-side switch are coupled in series between the coupling node and a GND node, and a number of the P-side switches and the N-side switches that are turned on in the first mode is larger than a number of the P-side switches and the N-side switches that are turned on in the second mode.

3. The circuit device according to claim 1, wherein the waveform shaping circuit includes:

a first buffer circuit; and a second buffer circuit provided at a stage subsequent to the first buffer circuit, each buffer circuit of the first buffer circuit and the second buffer circuit includes:

a plurality of P-type transistors and a plurality of P-side switches in which each P-type transistor and each P-side switch are coupled in series between a power supply node and a coupling node; and a plurality of N-type transistors and a plurality of N-side switches in which each N-type transistor and each N-side switch are coupled in series between the coupling node and a GND node, and a number of the P-side switches and the N-side switches that are turned on in the first mode is larger than a number of the P-side switches and the N-side switches that are turned on in the second mode.

4. The circuit device according to claim 1, wherein the value of the second power supply voltage supplied to the waveform shaping circuit in the first mode is higher than the value of the second power supply voltage supplied to the waveform shaping circuit in the second mode.

5. The circuit device according to claim 1, wherein the second voltage value of the first power supply voltage is supplied to the oscillation circuit in the first mode, and the first voltage value of the first power supply voltage is supplied to the oscillation circuit in the second mode.

6. The circuit device according to claim 1, wherein the oscillation circuit includes:

a current source; and a drive circuit to which a current from the current source is supplied to drive a resonator, and a current supplied from the current source to the drive circuit in the first mode is larger than a current supplied from the current source to the drive circuit in the second mode.

7. The circuit device according to claim 1, wherein the oscillation circuit operates by being supplied with the first power supply voltage, and the waveform shaping circuit operates by being supplied with the second power supply voltage different from the first power supply voltage.

8. The circuit device according to claim 1, wherein the waveform shaping circuit operates by being supplied with the second power supply voltage smaller than the amplitude of the oscillation signal.

9. The circuit device according to claim 1, wherein a driving capability of the output circuit in the first mode is higher than a driving capability of the output circuit in the second mode.

10. The circuit device according to claim 1, wherein the waveform shaping circuit includes a P-type transistor and an N-type transistor, and the P-type transistor and the N-type transistor are coupled in series between a power supply node and a GND node, and both the P-type transistor and the N-type transistor are turned on during the transition period.

11. The circuit device according to claim 1, wherein the waveform shaping circuit includes a buffer circuit, the buffer circuit includes:

a plurality of P-type transistors and a plurality of P-side switches in which each P-type transistor and each P-side switch are coupled in series between a power supply node and a coupling node; and a plurality of N-type transistors and a plurality of N-side switches in which each N-type transistor and each N-side switch are coupled in series between the coupling node and a GND node, and a period during which both the plurality of P-type transistors and the plurality of N-type transistors that are turned on in the first mode is shorter than a period during which both the plurality of P-type transistors and the plurality of N-type transistors that are turned on in the second mode.

12. An oscillator configured to switch between a first mode in which phase noise of an output clock signal is lower than that in a second mode and the second mode in which power consumption is smaller than that in the first mode, the oscillator comprising:

a resonator; and a circuit device, wherein the circuit device includes:

a power supply circuit configured to generate a first power supply voltage and a second power supply voltage, the first power supply voltage has a first voltage value and a second voltage value that is higher than the first voltage value, the second voltage value of the first power supply voltage being higher than a value of the second power supply voltage;

an oscillation circuit configured to receive one of the first and second voltage values of the first power supply voltage and oscillate the resonator to generate an oscillation signal;

a waveform shaping circuit configured to receive the second power supply voltage and perform waveform shaping on the oscillation signal to obtain a rectangular wave clock signal; and an output circuit configured to output the output clock signal based on the clock signal, and the power supply circuit is further configured to supply the second voltage value of the first power supply voltage to the oscillation circuit to increase an amplitude of the oscillation signal, which corresponds to the second voltage value, such that a transition period between a low level and a high level in the first mode is shortened than the second mode when performing the waveform shaping on the oscillation signal to obtain the rectangular wave clock signal.

13. A circuit device configured to switch between a first mode in which phase noise of an output clock signal is lower than that in a second mode and the second mode in which power consumption is smaller than that in the first mode, the circuit device comprising:

a power supply circuit configured to generate a first power supply voltage and a second power supply voltage, the first power supply voltage has a first voltage value and a second voltage value that is higher than the first voltage value, the second voltage value of the first power supply voltage being higher than a value of the second power supply voltage;

an oscillation circuit configured to receive one of the first and second voltage values of the first power supply voltage and generate an oscillation signal;

a waveform shaping circuit configured to receive the second power supply voltage and perform waveform shaping on the oscillation signal to obtain a rectangular wave clock signal, the waveform shaping circuit including a buffer circuit; and an output circuit configured to output the output clock signal based on the clock signal, wherein the power supply circuit is further configured to supply the second voltage value of the first power supply voltage to the oscillation circuit to increase an amplitude of the oscillation signal, which corresponds to the second voltage value, such that a transition period between a low level and a high level in the first mode is shortened than the second mode when performing the waveform shaping on the oscillation signal to obtain the rectangular wave clock signal, the buffer circuit includes:

a plurality of P-type transistors and a plurality of P-side switches in which each P-type transistor and each P-side switch are coupled in series between a power supply node and a coupling node; and a plurality of N-type transistors and a plurality of N-side switches in which each N-type transistor and each N-side switch are coupled in series between the coupling node and a GND node, a number of the P-side switches and the N-side switches that are turned on in the first mode is larger than a number of the P-side switches and the N-side switches that are turned on in the second mode, and resistances of the plurality of P-type transistors and the plurality of N-type transistors in the first mode are lower than resistances of the plurality of P-type transistors and the plurality of N-type transistors in the second mode.

\* \* \* \* \*